United States Patent [19]

Wardenaar et al.

[11] Patent Number: 4,644,642
[45] Date of Patent: Feb. 24, 1987

[54] METHOD OF AND DEVICE FOR PLACING CHIP-TYPE ELECTRICAL AND/OR ELECTRONIC COMPONENTS ON A SUBSTRATE

[75] Inventors: Hendrik C. Wardenaar; Bernardus J. Kuppens, both of Eindhoven, Netherlands

[73] Assignee: U.S. Philips Corporation, New York, N.Y.

[21] Appl. No.: 772,196

[22] Filed: Sep. 3, 1985

Related U.S. Application Data

[63] Continuation of Ser. No. 479,585, Mar. 28, 1983, abandoned.

[30] Foreign Application Priority Data

Apr. 21, 1982 [NL] Netherlands ............... 8201653

[51] Int. Cl.[4] ................... H05K 3/30; B23P 19/00
[52] U.S. Cl. ............................. 29/834; 29/740; 228/6.2
[58] Field of Search ................ 29/832, 834, 740; 228/6.2

[56] References Cited

U.S. PATENT DOCUMENTS

| | | |
|---|---|---|
| 3,611,561 | 10/1971 | Dosier . |
| 3,859,723 | 1/1975 | Hamer et al. . |
| 3,958,740 | 5/1976 | Dixon . |
| 4,116,376 | 9/1978 | Delorme et al. . |
| 4,127,432 | 11/1978 | Kuwano et al. . |
| 4,151,945 | 5/1979 | Ragard et al. . |
| 4,290,732 | 9/1981 | Taki et al. . |
| 4,292,116 | 9/1981 | Takahashi et al. . |
| 4,345,371 | 8/1982 | Ohsawa et al. . |
| 4,346,514 | 8/1982 | Makizawa et al. . |
| 4,375,126 | 3/1983 | Dull et al. . |
| 4,381,601 | 5/1983 | Tamai et al. . |

FOREIGN PATENT DOCUMENTS

| | | |
|---|---|---|
| 7604900 | 11/1976 | Netherlands . |
| 7604903 | 11/1976 | Netherlands . |
| 2063227 | 6/1981 | United Kingdom . |

Primary Examiner—Mark Rosenbaum
Assistant Examiner—Carl J. Arbes
Attorney, Agent, or Firm—Jack E. Haken; James J. Cannon, Jr.

[57] ABSTRACT

A method of and a device for placing chip-type components on a substrate, in which a number of components are simultaneously picked up in presentation positions by means of a pick-up device which has a number of pick-up elements, after which the pick-up device is moved to a position over the substrate and each of the pick-up elements in succession is moved to a position over the desired position on the substrate by movement of the pick-up device and/or the substrate with respect to one another, after which the relevant component is deposited and released in the relevant position by the pick-up element.

8 Claims, 6 Drawing Figures

METHOD OF AND DEVICE FOR PLACING CHIP-TYPE ELECTRICAL AND/OR ELECTRONIC COMPONENTS ON A SUBSTRATE

This is a continuation of application Ser. No. 479,585, filed Mar. 28, 1983, now abandoned.

BACKGROUND OF THE INVENTION

1. Field of the Invention

The invention relates to a method of placing chip-type electrical and/or electronic components on a substrate, in which a number of components are simultaneously picked up in presentation positions by means of a pick-up device which comprises a number of pick-up elements, after which the pick-up device is moved to a position over the substrate.

2. Description of the Prior Art

A method of the kind which forms the subject of the present invention is disclosed in U.S. Pat. No. 4,292,116. According to the known method, the components are stacked in magazines and the magazines are arranged in a lattice-like pattern. Over the lattice-like pattern there is arranged a pick-up device which picks up a component from each of the magazines by suction, after which it transports these components to the substrate and simultaneously deposits them in the appropriate positions on the substrate. The known method and device are very well suitable for those cases where a large number of components must to be deposited each time in the same pattern on the same kind of substrate.

It is a drawback of the known device that the probability of errors is rather high during the periodic replacement of empty magazines by full magazines; moreover, during the filling of the magazines incorrect positioning of the components in the magazines can readily occur.

It is a further drawback that the lattice has a fixed subdivision which is usually too coarse to achieve optimum filling of a substrate.

When for some reason no component has been picked up from one magazine and deposited on the substrate, correction can be performed only at a later stage.

Each type of substrate requires a separate lattice, which implies high tooling costs for each type of substrate.

Also known are devices which comprise a single pick-up device which at each operation picks up one component, which is subsequently placed in the required position on the substrate. The pick-up device is controlled so that it can be positioned over each position on a substrate in accordance with a given program. The work rate of such a device is low.

SUMMARY OF THE INVENTION

It is an object of the invention to provide a method and a device of the kind set forth which permit high-speed mounting of components on substrates and which are very flexible, so that many types of components can be placed on substrates of widely varying dimensions.

The method in accordance with the invention is characterized in that by movement of the pick-up device and/or the substrate with respect to one another, each of the pick-up elements or groups of pick-up elements in succession is moved to a position (positions) over the relevant desired location (locations) on the substrate, after which the relevant component (components) is (are) released and deposited at the relevant location (locations) by the pick-up element (elements).

In the method in accordance with the invention, all the components are simultaneously picked-up from a fixed pattern of presentation positions. Subsequently, the pick-up device and/or the substrate are or is moved with respect to one another in directions such as to bring each of the pick-up elements in succession to a position over a prescribed location on the substrate. An infinite range of possibilities for the deposition of components is thus obtained, which means that the deposition locations as well as the substrate dimensions can be varied as desired. Exchanging of magazines is not necessary. The substrates can be provided with a very dense pattern of components. The same pick-up device is used for all the components, so that the tooling costs may be low.

The sequence in which the pick-up elements are successively positioned over the respective deposition locations can be so chosen in the method according to the invention that the distance to be travelled by the pick-up device and/or the substrate is always minimized. This ensures a short mounting time for each component.

In a preferred version of the method in accordance with the invention, after picking up the components the pick-up device is first moved to a position over an adhesive-applying device which comprises a number of adhesive-applying members which are arranged in the same pattern as the presentation positions. All components can thus be provided with adhesive in one movement, without any rearrangement of the adhesive-applying members being required for different substrates.

In a further preferred embodiment, the pick-up device and/or the substrate are or is moved by means of a drive which can be controlled in accordance with a program which also controls the pick-up elements.

Instead of using a program-controlled drive for the movement of the pick-up device and/or the substrate, it is alternatively possible to control the pick-up device and/or the substrate by means of a pantograph which scans a specimen substrate. Scanning of the specimen by means of the pantograph can be performed by hand, so that this method is very suitable for mounting components on a small series of substrates. The program-controlled method is very suitable for a larger series, for which a very short mounting time can be achieved and the device can be very quickly adjusted to a different kind of substrate or a different mounting sequence, because only a program need be replaced.

The invention also relates to a device for performing the described method. The device comprises a pick-up device which has a number of pick-up elements, arranged in a given pattern, said pick-up device being movable between a position in which the pick-up elements are situated over a number of component presentation positions and a position in which the pick-up device is situated over a substrate support. The device in accordance with the invention is characterized in that it comprises at least two mutually perpendicular guides on which the pick-up device can move from a position over the presentation positions to a position over the substrate support, the pick-up device or the substrate support being movable in a direction perpendicular thereto so that each of the pick-up elements or groups of pick-up elements in succession can be positioned over the relevant location (locations) on the substrate, at which location (locations) each of the pick-up elements or groups of pick-up elements can separately place and release its component (components) on the substrate.

In a preferred embodiment, the pick-up device is carried by two carriages which are movable in mutually perpendicular directions and each of which is coupled to a drive.

In a further embodiment, the carriage drives and the pick-up elements are arranged to be controlled by means of a program.

The carriage drives and the pick-up elements may alternatively be arranged to be controlled by means of a pantograph.

A device is thus obtained whereby components can be placed on substrates in a fast, reliable and inexpensive manner; this device is also so flexible that it can be very quickly adapted to changing circumstances.

The pick-up elements may all be arranged in one or more rows. The distance between the elements in the or each row may equal half the distance between the presentation positions. In this embodiment, first the odd-numbered elements each pick-up a component from a first row of presentation positions, and subsequently the even-numbered elements each pick up a component from a second row of presentation positions. This embodiment offers the advantage that the transverse dimension of the pick-up device is limited, so that the space in which the device operates in the lateral direction will not be too large; this is advantageous when a number of such devices are arranged adjacent one another.

BRIEF DESCRIPTION OF THE DRAWINGS

The invention will be described in detail hereinafter with reference to the drawings.

DESCRIPTION OF THE PREFERRED EMBODIMENTS

Figure 1:
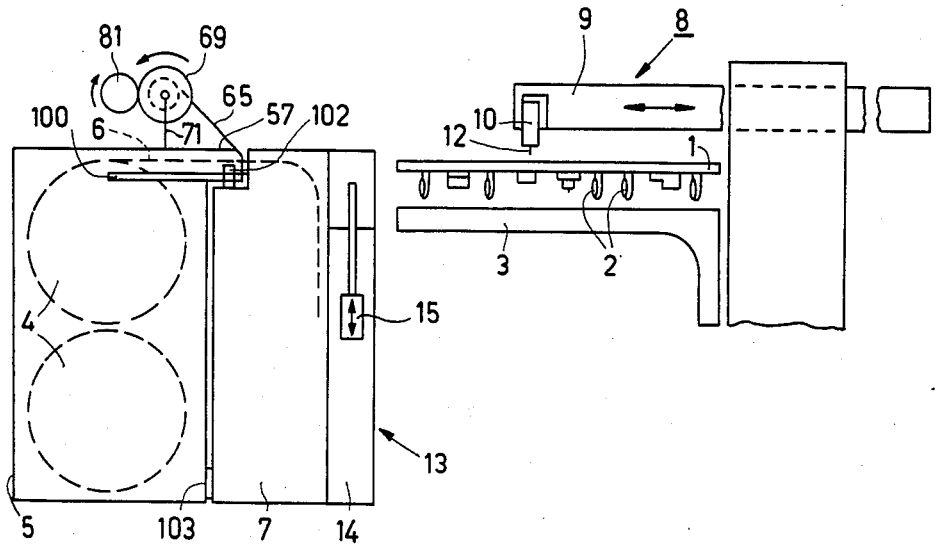
FIGS. 1 and 2 are a diagrammatic side elevation and a plan view, respectively, of a device for placing components on a substrate.
Figure 2:
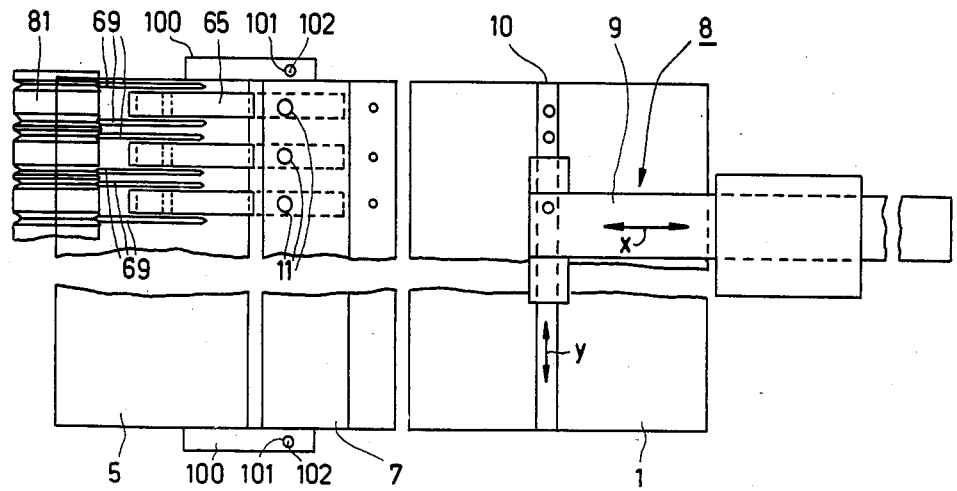

FIGS. 1 and 2 are a side elevation and a plan view, respectively, of one feasible embodiment of a device for placing components on a substrate. The reference numeral 1 denotes a substrate, for example, a printed circuit board, which has already been provided on its lower side with conventional components 2 whose lead-outs are positioned in holes in the substrate. On the upper side of the substrate there are to be provided a large number of further components which are very small and which do not comprise lead-outs. The dimensions of this kind of component, which is also referred to as a "chip-type" component, are of the order of 2.3×1.6 mm. These components must be very accurately positioned on the substrate at a very small distance from one another.

The substrate 1 is supported by a substrate carrier 3.

The components to be placed on the substrate are packaged in tapes, the components being loosely arranged in cavities in the tape which are closed on one side by a lower foil and on the other side by a cover foil.

A number of such tapes are wound on reels 4 in a holder 5. The holder 5 comprises on both sides a projecting plate 100 with a hole 101 which can co-operate with a pin 102 on a feed device 7. At the bottom the holder 5 bears against the feed device through two supports 103.

The tapes 6 extend from the reels 4 to a device for feeding the tapes to a number of presentation positions 11 for the components. The components can be picked up in these positions by a transfer mechanism 8. The transfer mechanism 8 mainly comprises a carriage 9 which is movable in the X-direction and a pick-up device 10 which is movable relative to the carriage in the Y-direction. The pick-up device 10 also comprises a number of pick-up elements 12 which are constructed as suction tubes.

The holder 5 and the feed device 7 may be constructed as described in detail in U.S. Patent application Ser. No. 399,042, filed July 16, 1982, and assigned to the assignee of the present invention.

The pick-up elements 12 are arranged in the pick-up device 10 in a pattern which corresponds to the pattern of the presentation positions 11. This means that when the pick-up device 10 has been moved to a position over the presentation positions by movement of the carriage 9, each of the pick-up elements is situated over a presentation position.

The suction tubes 12 are then moved to contact the components and all the suction tubes simultaneously pick up a component.

Subsequently, if desired, the pick-up device is moved to a position over an adhesive-applying device 13. This device comprises an adhesive container 14 and a number of reciprocable adhesive-applying members 15 which are arranged in the same pattern as the presentation positions and the pick-up elements. This construction enables the pick-up device, after picking up the components, to be displaced to a position over the adhesive-applying device so that adhesive can be simultaneously applied to all the components by raising the adhesive-applying members and/or lowering the suction tubes which carry the components.

Subsequently, the pick-up device 10 is moved further in the X-direction until it is in a position over the substrate. This operation is followed by a process during which each of the pick-up elements 12 in succession is moved to a location over the position on the substrate at which the relevant component is to be deposited. Deposition of the component is performed by lowering the relevant suction tube and, when the component contacts the substrate, by interrupting the vacuum connection to the tube.

Whenever feasible, several suction tubes which are present at the same time over the appropriate position on the substrate can be operated simultaneously, so that a group of components can be placed on the substrate in a selected position of the pick-up device.

The carriage 9 and the pick-up device 10 may each be driven by a separate motor; the motors can be controlled by a program.

The program will preferably be designed so that the pick-up device always travels the shortest possible distance over the substrate.

Although the presentation positions 11 and the pick-up elements 12 are arranged in a straight line in the present embodiment, obviously other arrangements may alternatively be chosen.

In the above-described embodiment, movements in both the X and Y directions are imparted to the pick-up device. Alternatively, the X-movement may be performed by the carriage 9 and the Y-movement by the substrate, in which case, for example, the substrate support 3 must be displaceable on a suitable guide.

Figure 3:
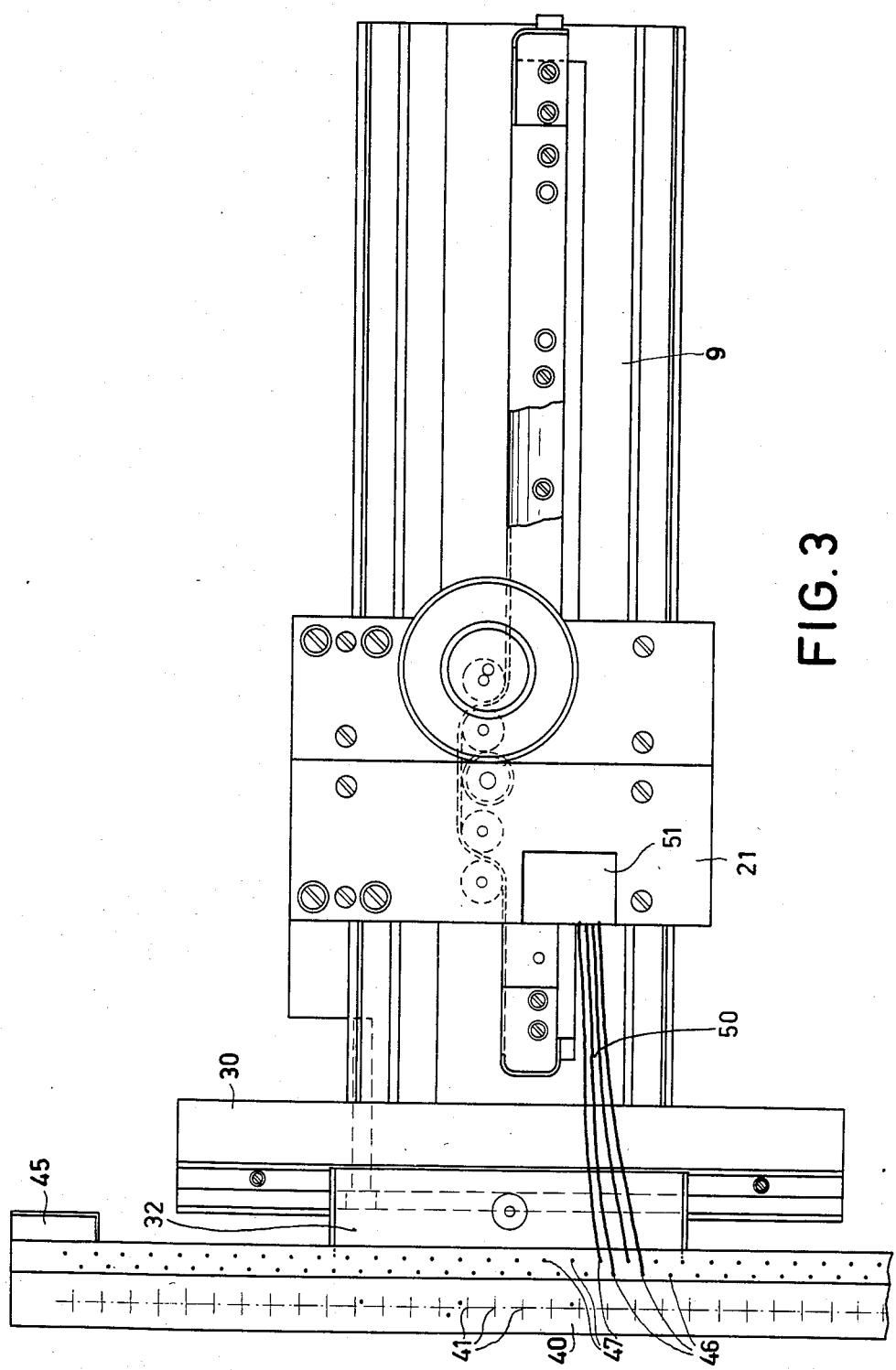
FIGS. 3, 4 and 5 are a plan view, a part sectional side elevation and a sectional view taken along the line V—V, respectively, of the transfer mechanism of the device shown in the FIGS. 1 and 2.
Figure 4:
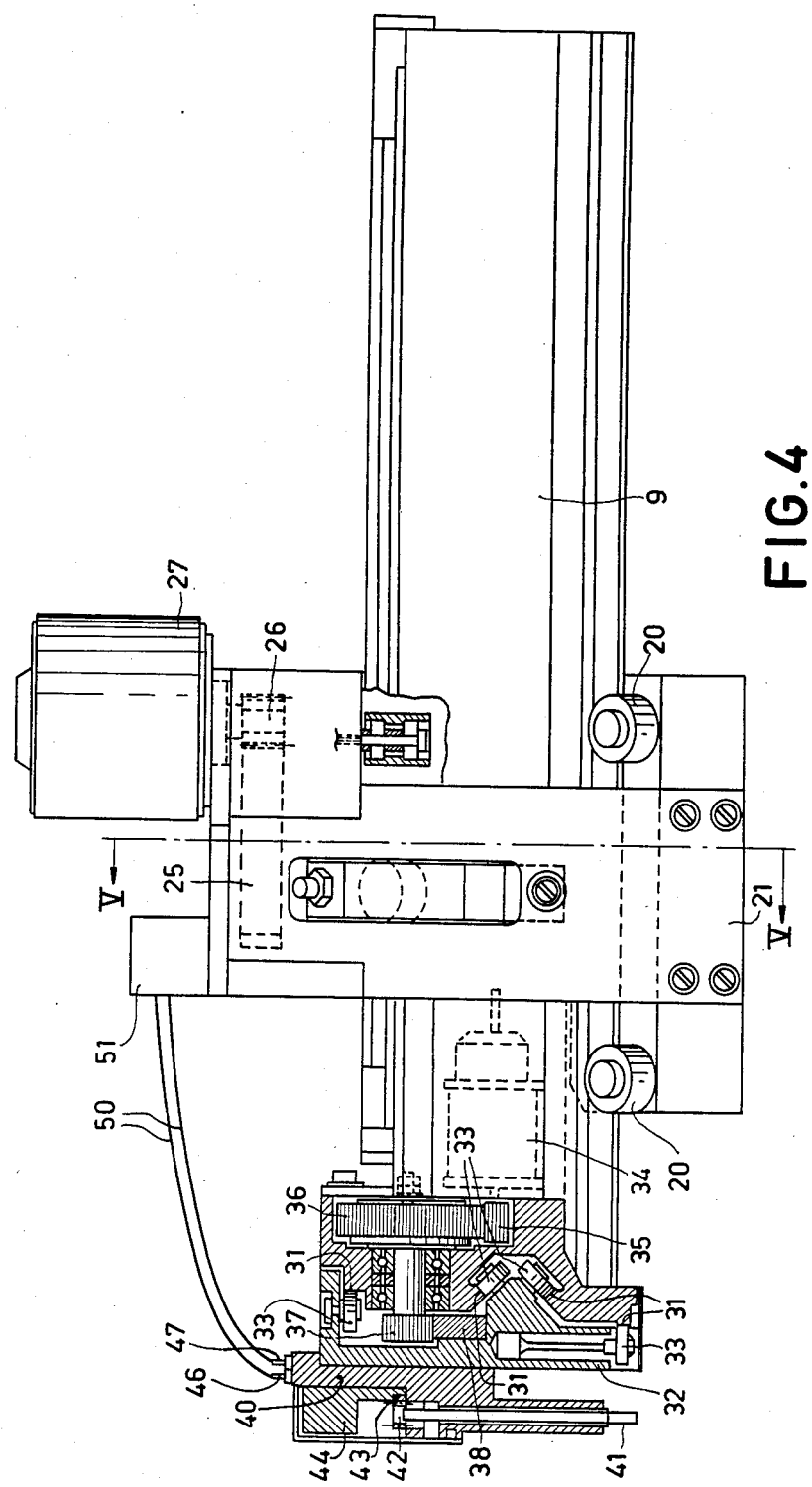
Figure 5:
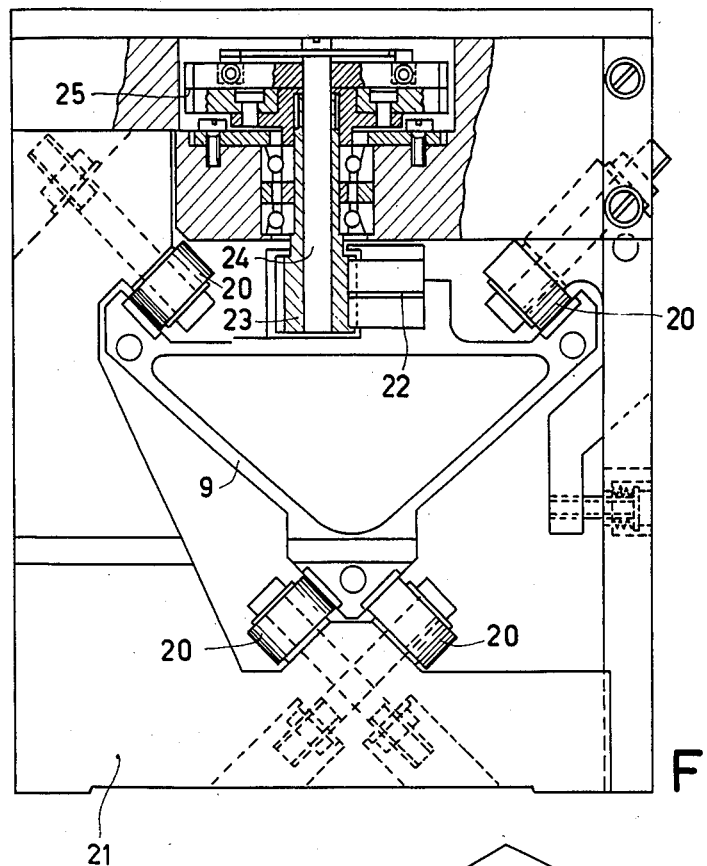

FIGS. 3, 4 and 5 show the transfer mechanism 8 in a plan view, a part-sectional side elevation and a cross-section taken along the line V—V, respectively.

These Figures show how the carriage 9 is guided on a number of rollers 20 which are rotatable about shafts which are rigidly mounted in the housing 21.

The carriage 9 comprises a rack 22 which is engaged by a pinion 23. The pinion 23 is fixed on a shaft 24 which is journalled in the housing 21 and whose upper end carries a gearwheel 25 which meshes with a gearwheel 26 on the shaft of an electric motor 27. The carriage 9 can thus be moved to and fro in the housing 21 by means of the motor 27.

The carriage 9 comprises at one end a transverse section 30 which comprises a number of guides 31.

A transverse carriage 32 co-operates with the guides 31 through a number of rollers 33.

Via gearwheels 35-36-37, an electric motor 34 drives a rack 38 which forms part of the transverse carriage 32.

A bar-shaped section 40 which supports a large number of suction tubes 41 (32 in this case) is coupled to the transverse carriage 32. The suction tubes may, for example, have a construction as described in U.S. Pat. No. 4,527,327.

Each of the suction tubes 41 can be moved downwards by compressed air, against the force of a spring, in order to be connected to a vacuum source in this position. The holder accommodating each of the suction tubes is provided at its upper end with a pinion 42 which meshes with a rack 43. Rack 43 is connected to a section 44 which extends over the full length of the bar 40 and which can be moved to and fro between two positions by means of an air motor 45. The stroke of the section 44 is such that the suction tubes each perform a rotation of 180° during each stroke.

Each of the suction tubes 41 communicates with an associated compressed air connection 46 and an associated vacuum connection 47. Each of these connections is connected, via a flexible pipe 50, to a valve block 51 which comprises controllable valves which open and close the relevant pipes at appropriate instants under the control of a program.

Thus, a device is obtained with which first all the suction tubes 41 can be positioned over the chip presentation positions in accordance with a given program.

Subsequently, all the valves of the valve block 51 can be simultaneously opened so that the suction tubes are lowered onto the chips which are subsequently picked up by the suction in the tubes.

Subsequently, the bar 40 with the suction tubes 41 is moved to a position over the adhesive-applying device, so that adhesive is applied to the chips.

Subsequently, the bar 40 with the suction tubes 41 is moved to a position over a substrate and the motors 27 and 34 are operated so that each of the suction tubes in succession is brought to a position over the location in which the relevant component is to be placed on the substrate.

When a suction tube has been positioned over the relevant location on the substrate, the relevant air valve is opened and the suction tube lowers the component onto the substrate, after which the suction is interrupted. Prior to the placing of the component on the substrate, the relevant suction tube may also be rotated through 180°.

A substrate can thus be very quickly provided with components in accordance with a fixed program.

Figure 6:
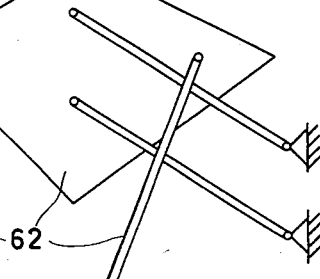
FIG. 6 diagrammatically shows a further embodiment of a transfer mechanism.

Finally, FIG. 6 shows how the suction tube bar 60 may also be connected to a bar 61 which is connected to a pantograph system 62. The bar 60 can thus be placed in any desired position. The suction tubes are controlled by means of compressed air and vacuum via an appropriate valve block whose valves are controlled in accordance with the position occupied by the bar 60. The bar 60 also comprises a pin 63 which is moved successively to positions over a given number of reference points in accordance with a given program.

What is claimed is:

1. An improved method of placing chip-type electrical components on a substrate, including the steps of positioning a pick-up device having a plurality of pick-up elements over a supply of components such that simultaneously each of said pick-up elements picks up one component, and subsequently positioning the pick-up device over a substrate; characterized by the additional steps of moving said pick-up device relative to said substrate;

calculating a sequence in which each of said pick-up elements is sequentially positioned over the substrate position designated to receive the component held by said element such that the distance to be travelled by said pick-up device is as short as possible;

moving sequentially each pick-up element to that position over said substrate designated to receive the component held by that pick-up element;

depositing one component on said designated position from said one pick-up element positioned over said designated position for receiving said component on said substrate;

continuing said sequence until all components picked up by said pick-up device have been deposited on said substrate; and controlling the relative motion of the pick-up device and the substrate by means of a program and controlling the movement of said pick-up elements by said program.

2. In a method for placing chip-type electrical components on a substrate in a predetermined arrangement, including the steps of positioning a pick-up device having a plurality of pick-up elements over a supply of components, controlling said pick-up elements such that each of said pick-up elements picks up one of said components simultaneously, and subsequently positioning the pick-up device over a substrate, the improvement comprising the additional steps of:

determining a sequence of movements of said pick-off device relative to said substrate whereby each of said pick-up elements is positioned over the corresponding location on the substrate designated to receive the component being held by the positioned pick-up element, said pick-up elements being positioned in sequence, and whereby the distance traveled by said pick-up device relative to said substrate is minimized;

controlling said pick-up device and said substrate to perform said relative movements in sequence; and depositing the components being held by said pick-up elements in sequence on the corresponding locations on the substrate designated to receive said components.

3. The method of claim 2, wherein the relative movements of said pick-up device and said substrate are controlled by a computer program.

4. An improved device for placing chip-type electrical components on a substrate, said device including a movable pick-up means having a plurality of pick-up elements, said pick-up elements being arranged in a defined pattern, and being movable such that each pick-up element may be positioned over a designated location in which components are situated for pick-up and from which each element may pick up one component and including said pick-up elements subsequently being movable by drive means to a position over a substrate support wherein the improvement comprises:

a housing in which a transfer means is mounted;

said transfer means including a first electrically driven carriage means mounted in said housing;

said first electrically driven carriage means having a first guide means for movement in the X-axis;

a second electrically driven carriage means perpendicular to said first electrically driven carriage means and having second guide means perpendicular to said first guide means and connected thereto by rollers for movement in the y-axis;

means on said second carriage means to support said pick-up means;

said two mutually perpendicular guide means permitting said pick-up means to move in a first direction from a position over said components to a position over said substrate support via said first guide means; and said pick-up means to move in a second direction perpendicular to said first direction via said second guide means so that each of said pick-up elements can be positioned sequentially over one designated position on said substrate, in which position each of said pick-up elements can separately place and release its component on one designated position on said substrate; and program means for controlling said drive means and said pick-up elements.

5. A device as claimed in claim 4 characterized in that said pick-up elements are arranged in at least one row.

6. A device as claimed in claim 5 characterized in that the distance between said pick-up elements in each row equals half the distance between said component positions.

7. In a device for placing chip-type electrical components on a substrate in accordance with a first predetermined pattern, said device including a housing, a first carriage means mounted in said housing and slidably displaceable in the X direction, a second carriage means mounted in said first carriage means and slidably displaceable in the Y direction, a pick-up means securely mounted on said second carriage means, said pick-up means having a plurality of pick-up elements each capable of picking up and depositing an electrical component, means for driving said first and second carriage means, and means for controlling said driving means whereby said pick-up means is moved relative to said substrate and for controlling said pick-up elements whereby each of said pick-up elements can pick up and deposit an electrical component, the improvement wherein said pick-up elements are arranged on said pick-up means in accordance with a second predetermined pattern, said second predetermined pattern being different than said first predetermined pattern.

8. The improved device of claim 7, wherein said control means comprises a computer program.

* * * * *